United States Patent
Ikemoto et al.

(10) Patent No.: US 10,374,305 B2
(45) Date of Patent: Aug. 6, 2019

(54) MULTILAYER SUBSTRATE AND ELECTRONIC DEVICE

(71) Applicant: Murata Manufacturing Co., Ltd., Nagaokakyo-shi, Kyoto-fu (JP)

(72) Inventors: Nobou Ikemoto, Nagaokakyo (JP); Jun Sasaki, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/881,857

(22) Filed: Jan. 29, 2018

(65) Prior Publication Data

US 2018/0151951 A1 May 31, 2018

Related U.S. Application Data

(63) Continuation of application No. PCT/JP2016/069838, filed on Jul. 5, 2016.

(30) Foreign Application Priority Data

Jul. 30, 2015 (JP) .................................. 2015-151346

(51) Int. Cl.
*H01Q 1/52* (2006.01)
*H01Q 1/40* (2006.01)
(Continued)

(52) U.S. Cl.
CPC ................ *H01Q 1/52* (2013.01); *H01Q 1/40* (2013.01); *H01Q 7/06* (2013.01); *H05K 1/115* (2013.01);
(Continued)

(58) Field of Classification Search
CPC .. H01Q 1/52; H01Q 1/22; H01Q 1/38; H01Q 1/40; H01Q 3/02; H01Q 7/06
See application file for complete search history.

(56) References Cited

U.S. PATENT DOCUMENTS

2012/0056796 A1* 3/2012 Kato .................... H01L 23/5387
  343/788
2013/0112754 A1* 5/2013 Ikemoto ............. G06K 7/10336
  235/488
(Continued)

FOREIGN PATENT DOCUMENTS

JP 07-86754 A 3/1995
JP 2006-310758 A 11/2006
(Continued)

OTHER PUBLICATIONS

Official Communication issued in Japanese Patent Application No. 2017-531102, dated Oct. 23, 2018.
(Continued)

*Primary Examiner* — Hoang V Nguyen
(74) *Attorney, Agent, or Firm* — Keating & Bennett, LLP

(57) ABSTRACT

A multilayer substrate, in which flexible insulating base materials are laminated, includes first and second regions. The number of laminated insulating base materials in the second region is smaller than that in the first region. The multilayer substrate includes a coil antenna located in the first region, a magnetic member located in the first region, a mounting component located in the first region, a wiring pattern, and an external connection terminal. The mounting component entirely overlaps the magnetic member when viewed in a thickness direction and is located on a side opposite to the coil antenna across the magnetic member in the thickness direction. At least a portion of the coil antenna overlaps the magnetic member when viewed in the thickness direction.

20 Claims, 10 Drawing Sheets

(51) Int. Cl.
*H01Q 7/06* (2006.01)
*H05K 1/11* (2006.01)
*H05K 1/18* (2006.01)
*H05K 1/14* (2006.01)
*H05K 1/16* (2006.01)
*H01Q 1/22* (2006.01)
*H01Q 1/38* (2006.01)
*H05K 3/06* (2006.01)
*H05K 3/46* (2006.01)
*H05K 1/02* (2006.01)
*H01Q 3/02* (2006.01)

(52) U.S. Cl.
CPC .............. *H05K 1/147* (2013.01); *H05K 1/165* (2013.01); *H05K 1/181* (2013.01); *H01Q 1/22* (2013.01); *H01Q 1/38* (2013.01); *H01Q 3/02* (2013.01); *H05K 1/028* (2013.01); *H05K 1/117* (2013.01); *H05K 3/06* (2013.01); *H05K 3/4635* (2013.01); *H05K 3/4652* (2013.01); *H05K 3/4691* (2013.01); *H05K 2201/086* (2013.01); *H05K 2201/10098* (2013.01); *H05K 2201/10189* (2013.01); *H05K 2201/2009* (2013.01)

(56) References Cited

U.S. PATENT DOCUMENTS

| | | |
|---|---|---|
| 2013/0161077 A1 | 6/2013 | Watanabe |
| 2015/0035718 A1 | 2/2015 | Gouchi et al. |
| 2015/0138030 A1* | 5/2015 | Yosui .................. H01Q 1/38 343/895 |
| 2015/0294781 A1 | 10/2015 | Yosui et al. |
| 2016/0198070 A1 | 7/2016 | Nakano et al. |

FOREIGN PATENT DOCUMENTS

| | | |
|---|---|---|
| JP | 2011-108922 A | 6/2011 |
| JP | 5743034 B2 | 7/2015 |
| WO | 2010/131524 A1 | 11/2010 |
| WO | 2012/029359 A1 | 3/2012 |
| WO | 2012/036139 A1 | 3/2012 |
| WO | 2014/024762 A1 | 2/2014 |
| WO | 2015/041066 A1 | 3/2015 |

OTHER PUBLICATIONS

Official Communication issued in International Patent Application No. PCT/JP2016/069838, dated Sep. 27, 2016.

* cited by examiner

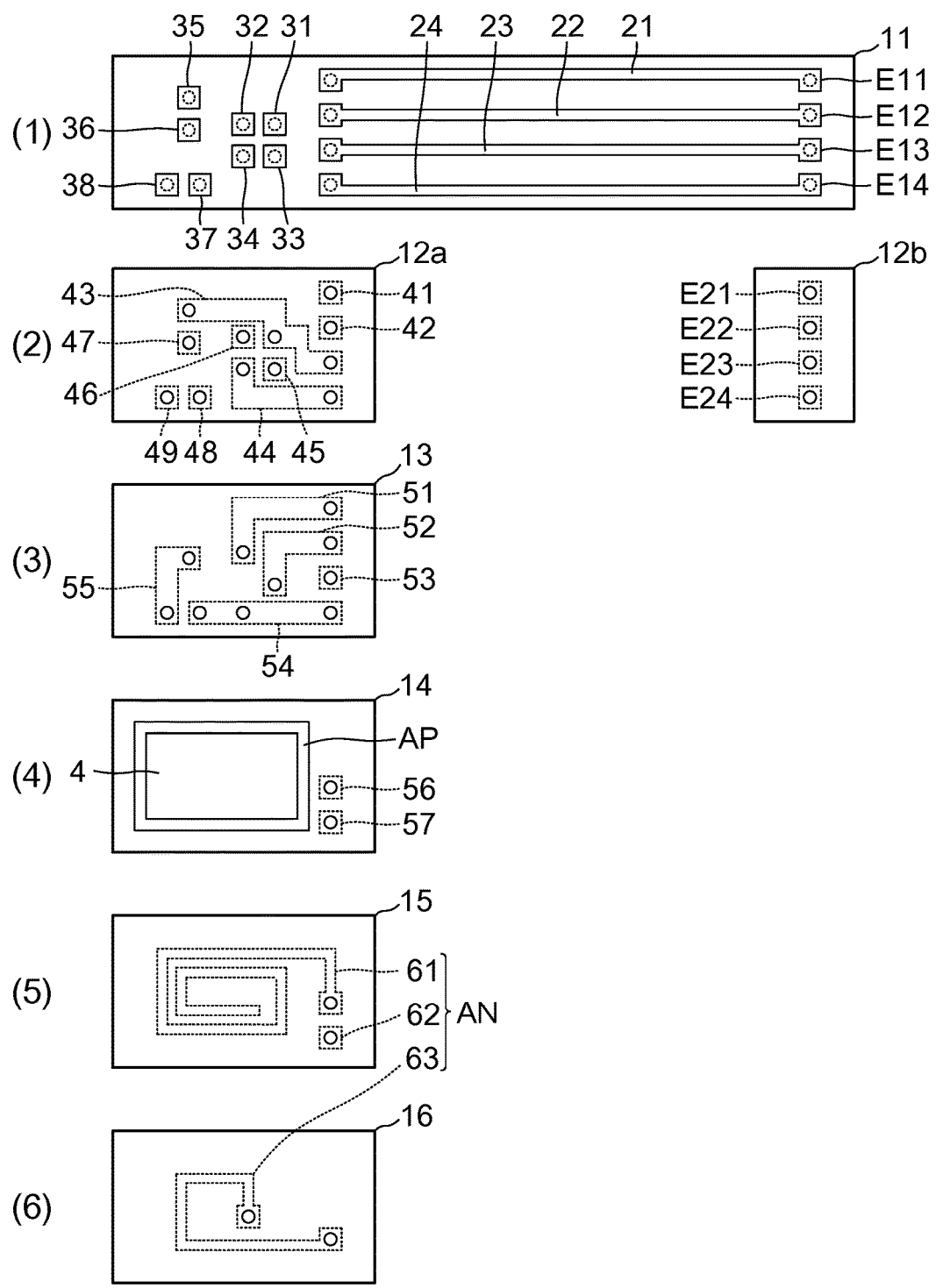

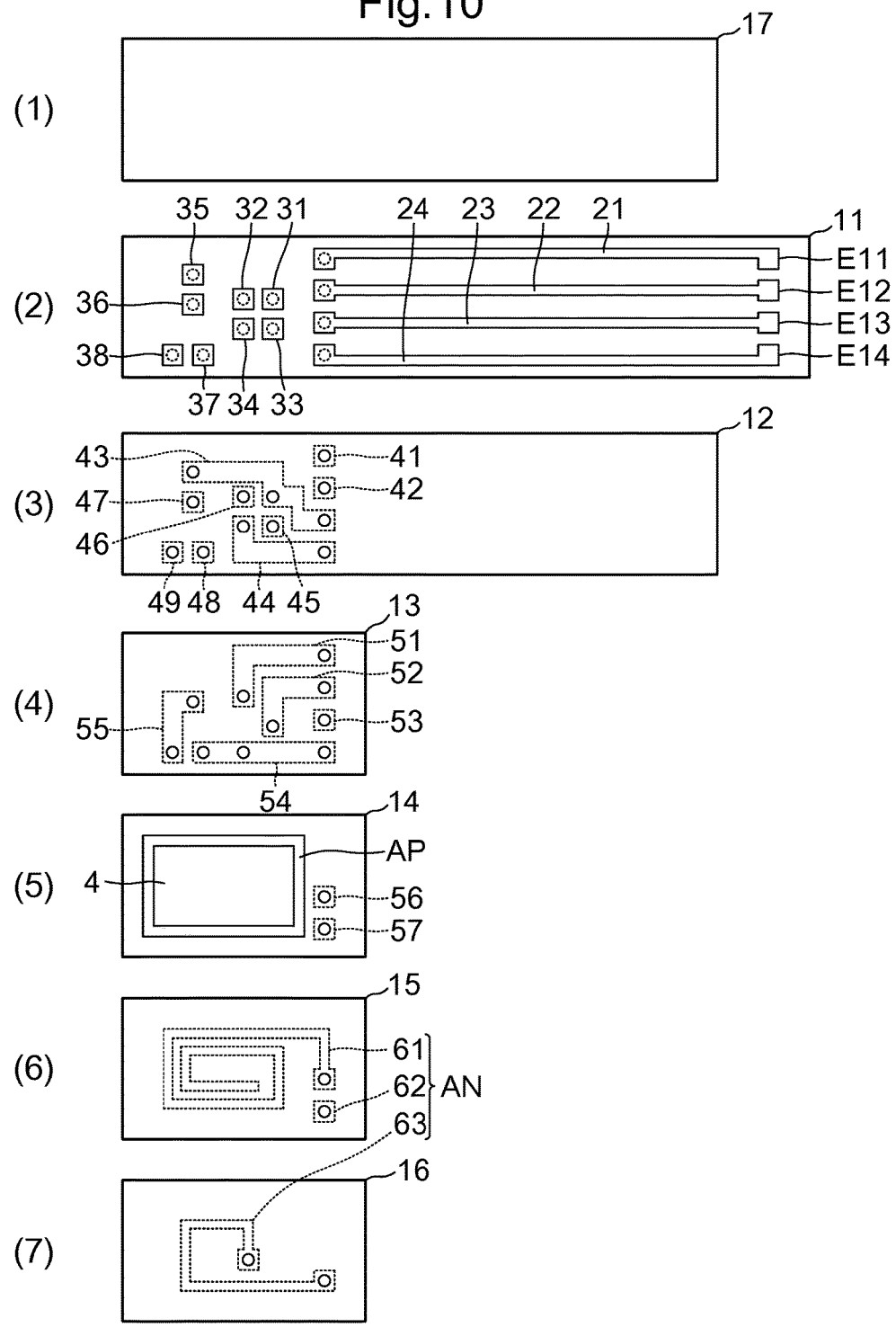

MULTILAYER SUBSTRATE AND ELECTRONIC DEVICE

CROSS REFERENCE TO RELATED APPLICATIONS

This application claims the benefit of priority to Japanese Patent Application No. 2015-151346 filed on Jul. 30, 2015 and is a Continuation Application of PCT Application No. PCT/JP2016/069838 filed on Jul. 5, 2016. The entire contents of each application are hereby incorporated herein by reference.

BACKGROUND OF THE INVENTION

1. Field of the Invention

The present invention relates to a multilayer substrate and an electronic device and particularly relates to a multilayer substrate including, for example, a coil antenna and a magnetic member and component and an electronic device including the multilayer substrate.

2. Description of the Related Art

Conventionally, a surface mount coil antenna included in a HF band communication system has been devised.

For example, WO 2014/024762 discloses a surface mount antenna device including a multilayer substrate, a coil antenna, a first ground conductor and a second ground conductor, and an interlayer connection conductor. A plurality of dielectric sheets is laminated in the multilayer substrate. The coil antenna includes a winding axis orthogonal or substantially orthogonal to a lamination direction of the multilayer substrate. The first ground conductor and second ground conductor are located on the outer side of a coil conductor. The interlayer connection conductor electrically connects the first ground conductor and the second ground conductor to each other. A surface mount antenna device is mounted on a wiring substrate (printed wiring substrate), and a winding axis of the coil antenna is parallel or substantially parallel to a main surface of the wiring substrate.

However, in the case where the antenna device described in WO 2014/024762 is mounted on the main surface of a wiring substrate or the like, if another electronic component or structure is located adjacent to or in vicinity of the antenna device, magnetic flux interlinking the coil antenna is disturbed, and the magnetic flux interlinking with the coil antenna of a communication partner is reduced. For this reason, not to reduce the magnetic flux interlinking with the coil antenna of the communication partner, it is necessary to mount the antenna device at a position around which no other electronic components or structures are located. Therefore, the degree of freedom in arrangement of the antenna device is low.

In addition, since a metal member, for example, a conductor pattern or a ground conductor, is usually in contact with a wiring substrate or the like, when the antenna device described in WO 2014/024762 is mounted on the main surface of the wiring substrate or the like, the metal member and the coil antenna may be unnecessarily coupled with each other. Therefore, a coupling coefficient with the antenna of the communication partner decreases, and as a result, communication characteristics of the coil antenna may be degraded.

SUMMARY OF THE INVENTION

Preferred embodiments of the present invention provide multilayer substrates that each include a coil antenna, provide a high degree of freedom in arrangement, and are able to significantly reduce or prevent degradation of communication characteristics of the coil antenna. Preferred embodiments of the present invention also provide electronic devices each including one of the multilayer substrates.

A multilayer substrate according to a preferred embodiment of the present invention includes a plurality of insulating base materials that are flexible and laminated thereon.

The multilayer substrate includes a first region and a second region. The number of laminated insulating base materials in the first region is different from that in the second region, and the second region is bent.

The number of laminated insulating base materials in the second region is smaller than the number of the laminated insulating base materials in the first region.

The multilayer substrate includes a coil antenna, a magnetic member, a component, a wiring pattern, and an external connection terminal. The coil antenna is located in the first region and includes a winding axis extending along a lamination direction of the insulating base materials in the first region. The magnetic member is located in the first region. The component is located in the first region and located on a side opposite to the coil antenna across the magnetic member in the lamination direction. The wiring pattern is located in the second region. The external connection terminal is located in the second region and electrically connected to the wiring pattern.

The component overlaps the magnetic member when viewed in the lamination direction.

At least a portion of the coil antenna overlaps the magnetic member when viewed in the lamination direction.

The insulating base material in the second region is located in a bent state on a side opposite to the coil antenna across the magnetic member in the lamination direction.

Accordingly, the coil antenna is able to be easily located at a position away from other electronic components and structures that may affect the coil antenna. In addition, the coil antenna is able to be easily located at a position away from a metal member, for example, a conductor pattern or a ground conductor, in contact with wiring substrate or the like that is able to affect the coil antenna. That is, the degree of freedom in arrangement of the coil antenna is high, and deterioration of the communication characteristics of the coil antenna due to an arrangement position is able to be significantly reduced or prevented. Furthermore, since the above component is mounted on the multilayer substrate, the component is able to be located in a gap between the substrates or the like. Therefore, a space is able to be utilized more effectively than in the case of mounting the component on the wiring substrate.

Unnecessary coupling between the wiring pattern in contact with the insulating base material in the second region and the coil antenna is significantly reduced or prevented by a magnetic shielding effect of the magnetic member. Further, due to the magnetic shielding effect of the magnetic member, it is possible to significantly reduce or prevent radiation of a magnetic field from the coil antenna on the side opposite to the coil antenna across the magnetic member in the lamination direction and to provide a multilayer substrate with a high degree of freedom in arrangement and directivity in various directions.

In addition, the component is located on the side opposite to the coil antenna across the magnetic member in the lamination direction. Therefore, unnecessary coupling between the component and the coil antenna is significantly reduced or prevented by the magnetic shielding effect of the magnetic member.

The coil antenna preferably includes a coil conductor, and the coil conductor includes a spiral shape. A coil antenna including a large number of turns is able to be easily provided. In addition, the size of the first region in which the coil antenna is located is able to be significantly reduced.

The coil conductor is preferably provided on the plurality of insulating base materials, and both ends of the coil conductor are preferably located on the outermost periphery of the coil conductor when viewed in the lamination direction. In the first region, an interlayer connection conductor located at a position that avoids the magnetic member and the coil antenna is able to be easily electrically connected.

The coil antenna preferably entirely overlaps the magnetic member when viewed in the lamination direction. Since the magnetic member overlaps a coil opening of the coil antenna, the magnetic shielding effect of the magnetic member is further significantly improved.

The wiring pattern preferably includes a plurality of wiring patterns located in parallel or substantially in parallel to each other, the plurality of wiring patterns includes a ground wiring pattern electrically connected to the ground, and the ground wiring pattern is a wiring pattern, among the wiring patterns, located on an outermost side in an arrangement direction patterns. Due to an electric field shielding effect of the wiring pattern as a ground wiring pattern, unnecessary coupling between the wiring pattern provided on the insulating base material in the second region and the coil antenna or unnecessary coupling with the outside is significantly reduced or prevented. Furthermore, unnecessary radiation from the wiring pattern is able to be significantly reduced or prevented.

An electronic device according to a preferred embodiment of the present invention includes the multilayer substrate as described above and a wiring substrate.

The external connection terminal of the multilayer substrate is electrically connected to the wiring substrate.

Accordingly, an electronic device is able to be provided which includes the multilayer substrate in which deterioration in communication characteristics of the coil antenna depending on the position of arrangement is significantly reduced or prevented, and the degree of freedom in arrangement is significantly improved.

The magnetic member is preferably located between the coil antenna and the wiring substrate. The magnetic member is certainly positioned between the wiring substrate and the coil antenna in the lamination direction, and the magnetic member magnetically shields the coil antenna. Therefore, unnecessary coupling with the wiring substrate and unnecessary coupling between the coil antenna and a metal member or a surface mount component provided on the wiring substrate are significantly reduced or prevented. Therefore, the decrease in a coupling coefficient with an antenna of a communication partner is significantly reduced or prevented, and communication characteristics of the coil antenna are significantly improved.

The coil antenna preferably does not overlap the wiring substrate when viewed in a direction perpendicular or substantially perpendicular to the main surface of the wiring substrate. The coil antenna is located at a position away from a metal member, for example, such as a conductor pattern or a ground conductor, in contact with a wiring substrate or the like that is able to affect the coil antenna. Therefore, since metal members and other electronic components or structures are not located adjacent to or in vicinity of the coil antenna, magnetic flux interlinking with the coil antenna is not disturbed, and a decrease in the magnetic flux interlinking with the coil antenna of the communication partner is able to be significantly reduced or prevented.

In the multilayer substrate, the winding axis of the coil antenna is not perpendicular to the main surface of the wiring substrate. A path of the magnetic flux generated at the coil antenna is able to be provided. That is, distribution of the magnetic flux generated at the coil antenna by unnecessary coupling with the wiring substrate or by a metal member and a surface mount component in contact with the wiring substrate is significantly reduced or prevented. Therefore, since the magnetic flux interlinking with the coil antenna is not disturbed, the magnetic flux interlinking with an antenna of the communication partner increases, and a communication distance is able to be increased.

According to preferred embodiments of the present invention, multilayer substrates are able to be provided each of which include a coil antenna, provide a high degree of freedom in arrangement, and significantly reduce or prevent degradation of communication characteristics of the coil antenna. Further, electronic devices each including a multilayer substrate are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded plan view of the multilayer substrate shown in FIG. 1.

FIG. 10 is an exploded plan view of the multilayer substrate shown in FIG. 9.

DETAILED DESCRIPTION OF THE PREFERRED EMBODIMENTS

Figure 1:
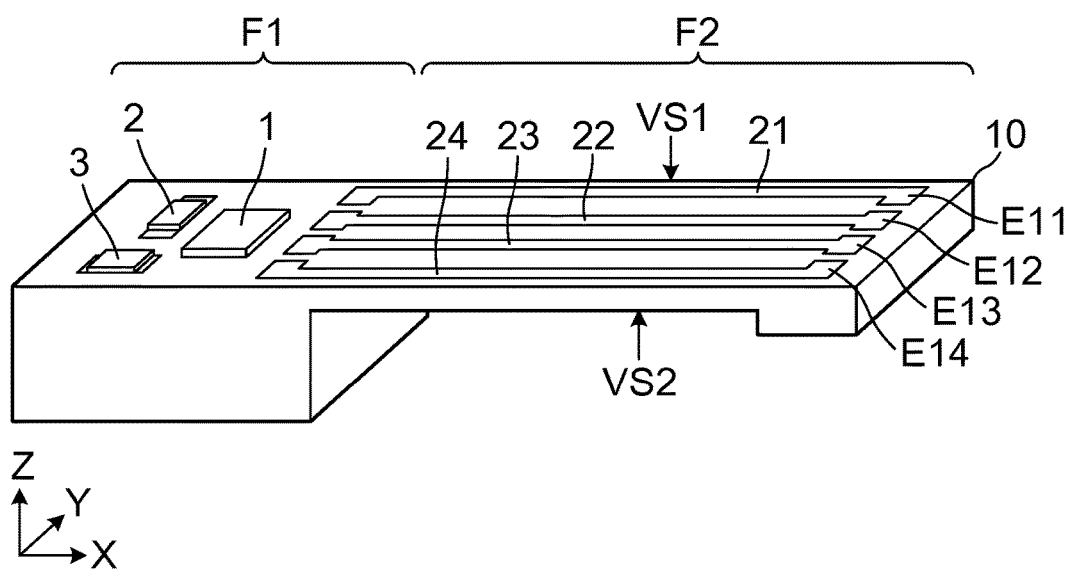
FIG. 1 is an external perspective view of a multilayer substrate according to a first preferred embodiment of the present invention.

Hereinafter, a plurality of preferred embodiments of the present invention will be described with reference to the drawings. The same or similar portions are denoted by the same reference numerals in each drawing. Each preferred embodiment is indicated for an example, and configurations indicated in different preferred embodiments are able to be partially replaced and combined.

First Preferred Embodiment

Figure 3A:
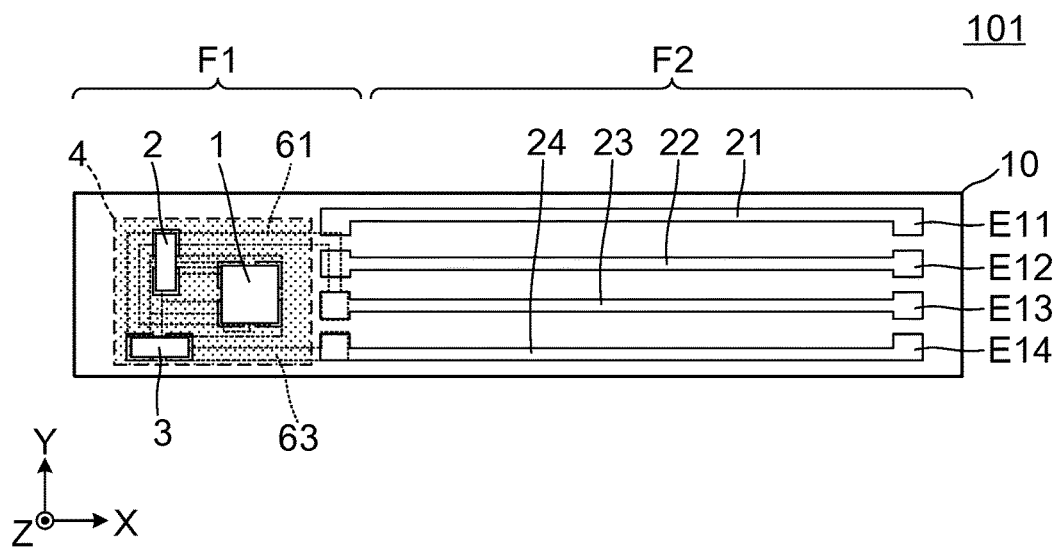
FIG. 3A is a plan view of the multilayer substrate shown in FIG. 1.
Figure 3B:
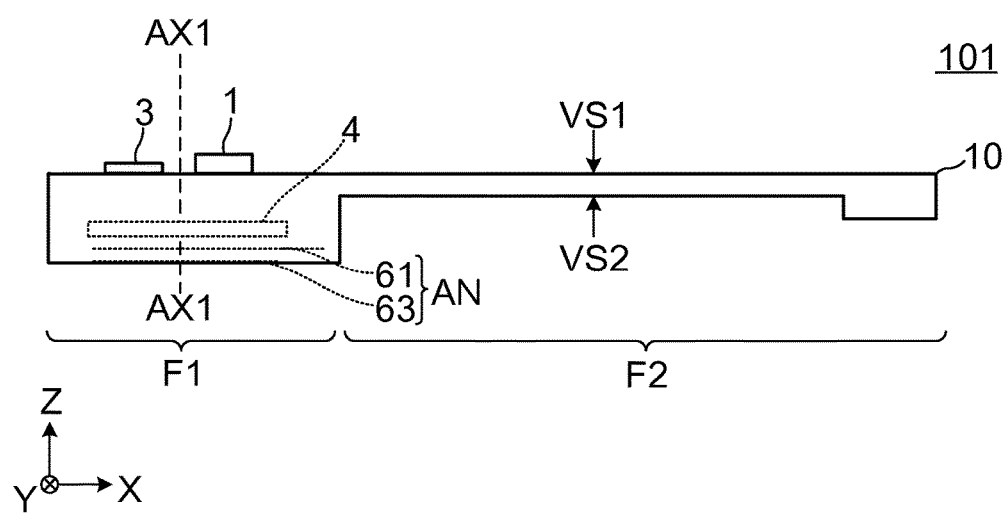
FIG. 3B is a front view of the multilayer substrate shown in FIG. 1.

FIG. 1 is an external perspective view of a multilayer substrate 101 according to a first preferred embodiment of the present invention. FIG. 2 is an exploded plan view of the multilayer substrate 101. FIG. 3A is a plan view of the multilayer substrate 101, and FIG. 3B is a front view of the multilayer substrate 101.

The multilayer substrate 101 includes a laminated body including a first region F1 and a second region F2, a coil antenna AN, mounting components 1, 2, and 3 which are examples of the "component" according to the present preferred embodiment, a magnetic member 4, wiring patterns 21, 22, 23, and 24, and external connection terminals E11, E12, E13, E14, E21, E22, E23, and E24. The second region F2 of the laminated body 10 is more flexible than the first region F1, and the first region F1 of the laminated body 10 is harder and more unlikely to bend than the second region F2.

As illustrated in FIGS. 1 and 2, the coil antenna AN is located in the first region F1 of the laminated body 10. The mounting components 1, 2, and 3 and the magnetic member 4 are located in the first region F1 of the laminated body 10. The wiring patterns 21, 22, 23, and 24 and the external connection terminals E11, E12, E13, E14, E21, E22, E23, and E24 are located in the second region F2 of the laminated body 10.

The laminated body 10 is a substantially elongated insulator flat plate whose longer side direction coincides with a lateral direction (X direction in FIG. 1) shorter side direction and coincides with longitudinal direction (Y direction). The laminated body 10 includes a first main surface VS1 and a second main surface VS2 facing each other. The laminated body 10 is provided by laminating a plurality of flexible insulating base materials 11, 12a, 12b, 13, 14, 15, and 16 in a thickness direction (Z direction in FIG. 1). This thickness direction (Z direction) corresponds to the "lamination direction".

In FIG. 2, the insulating base material 11 is the uppermost layer, and the insulating base material 16 is the lowermost layer. The insulating base materials 11, 12a, 12b, 13, 14, 15, and 16 are resin layers, for example, polyimide (PI) and liquid crystal polymer (LCP).

As illustrated in FIGS. 1 and 2, in the laminated body 10, the number of laminated insulating base materials in the first region F1 is different from that in the second region F2. The number of laminated insulating base materials 11 and 12b in the second region F2 is smaller than the number of laminated insulating base materials 11, 12a, 13, 14, 15, 16, and 17 in the first region F1. Therefore, the second region F2 is more flexible than the first region F1, and the first region F1 is harder than the second region F2 and does not easily bend.

The insulating base material 11 is a flexible rectangular or substantially rectangular flat plate. On an upper surface of the insulating base material 11 (a surface of the insulating base material 11 in FIG. 2), wiring patterns 21, 22, 23, and 24, electrodes 31, 32, 33, 34, 35, 36, 37, and 38, and external connection terminals E11, E12, E13, and E14 are provided. Further, in the insulating base material 11, a plurality of interlayer connection conductors extending in the thickness direction (Z direction) is provided. For example, the wiring patterns 21, 22, 23, and 24 are conductor patterns that supply power, conductor patterns of communication signal lines ($I^2C$, SPI, UART, etc.), and ground wiring patterns. Each interlayer connection conductor is, for example, a via conductor by providing a via hole in a base material layer and filling a conductive paste in the via hole.

The wiring patterns 21, 22, 23, and 24 are linear conductor patterns extending in a longer side direction (X direction) of the insulating base material 11 and located parallel or substantially parallel to the longitudinal direction (Y direction in FIG. 1). In the present preferred embodiment, this longitudinal direction (Y direction) corresponds to "arrangement direction". Among the wiring patterns 21, 22, 23, and 24, the wiring patterns 21 and 24 positioned on the outermost side in the arrangement direction (Y direction) are "ground wiring patterns" electrically connected to the ground. The first ends (right side end in FIG. 2) of the wiring patterns 21, 22, 23, and 24 are electrically connected to the external connection terminals E11, E12, E13, and E14, respectively. The external connection terminals E11, E12, E13, and E14 are rectangular or substantially rectangular conductor patterns provided in the first end portion in the longer-side direction of the insulating base material 11 (right side end of the insulating base material 11 in FIG. 2). The electrodes 31, 32, 33, 34, 35, 36, 37, and 38 are rectangular or substantially rectangular conductor patterns located near the second end in the longer side direction of the insulating base material 11 (left side end of the insulating base material 11 in FIG. 2).

The insulating base material 12a is a flexible rectangular or substantially rectangular flat plate. Conductors 41, 42, 43, 44, 45, 46, 47, 48, and 49 are located on a lower surface of the insulating base material 12a (back surface of the insulating base material 12a in FIG. 2). A plurality of interlayer connection conductors extending in the thickness direction (Z direction) is provided in the insulating base material 12a.

The conductor 41 is electrically connected to the second end (left side end in FIG. 2) of the wiring pattern 21 via one of the interlayer connection conductors. The conductor 42 is electrically connected to the second end of the wiring pattern 22 via one of the interlayer connection conductors. The conductor 43 is electrically connected to the second end of the wiring pattern 23, the electrode 31, and the electrode 35 via the interlayer connection conductors. The conductor 44 is electrically connected to the second end of the wiring pattern 24 and the electrode 34 via the interlayer connection conductors. The conductor 45 is electrically connected to the electrode 33 via one of the interlayer connection conductors. The conductor 46 is electrically connected to the electrode 32 via one of the interlayer connection conductors. The conductor 47 is electrically connected to the electrode 36 via one of the interlayer connection conductors. The conductor 48 is electrically connected to the electrode 37 via one of the interlayer connection conductors. The conductor 49 is electrically connected to the electrode 38 via one of the interlayer connection conductors.

The insulating base material 12b is a flexible rectangular or substantially rectangular flat plate. The external connection terminals E21, E22, E23, and E24 are located on a lower surface of the insulating base material 12b. In the insulating base material 12b, a plurality of interlayer connection conductors extending in the thickness direction (Z direction) is provided.

The external connection terminal E21 is electrically connected to the external connection terminal E11 via one of the interlayer connection conductors. The external connection terminal E22 is electrically connected to the external connection terminal E12 via one of the interlayer connection conductors. The external connection terminal E23 is electrically connected to the external connection terminal E13 via one of the interlayer connection conductors. The external connection terminal E24 is electrically connected to the external connection terminal E14 via one of the interlayer connection conductors. That is, the external connection terminals (E11, E12, E13, E14, E21, E22, E23, and E24) are located on both of the first main surface VS1 and the second main surface VS2 of the second region F2 of the laminated body 10.

The insulating base material 13 is a flexible rectangular or substantially rectangular flat plate. Conductors 51, 52, 53, 54, and 55 are located on a lower surface of the insulating base material 13 (back surface of the insulating base material 13 in FIG. 2). In the insulating base material 13, a plurality of interlayer connection conductors extending in the thickness direction (Z direction) is provided.

The conductor 51 is electrically connected to the conductors 41 and 45 via the interlayer connection conductors. The conductor 52 is electrically connected to the conductors 42 and 46 via the interlayer connection conductors. The conductor 53 is electrically connected to the conductor 43 via one of the interlayer connection conductors. The conductor 54 is electrically connected to the conductors 44 and 48 via the interlayer connection conductors. The conductor 55 is electrically connected to the conductors 47 and 49 via the interlayer connection conductors.

The insulating base material 14 is a flexible rectangular or substantially rectangular flat plate. Conductors 56 and 57 are located on a lower surface of the insulating base material 14 (back surface of the insulating base material 14 in FIG. 2). A plurality of interlayer connection conductors extending in the thickness direction (Z direction) is provided in the insulating base material 14.

The conductor 56 is electrically connected to the conductor 53 via one of the interlayer connection conductors. The conductor 57 is electrically connected to the conductor 54 via one of the interlayer connection conductors. As illustrated in FIG. 2, an opening AP including a rectangular or substantially rectangular planar shape is located near the center of the insulating base material 14. The opening AP defines a rectangular parallelepiped or substantially rectangular parallelepiped cavity by laminating the insulating base materials 13, 14, and 15. The magnetic member 4 is buried in this cavity. The magnetic member is, for example, a sintered rectangular parallelepiped or substantially rectangular parallelepiped magnetic ferrite plate.

The insulating base material 15 is a flexible rectangular or substantially rectangular flat plate. Coil conductors 61 and 62 are located on a lower surface of the insulating base material 15 (back surface of the insulating base material 15 in FIG. 2). In the insulating base material 15, a plurality of interlayer connection conductors extending in the thickness direction (Z direction) is provided.

The coil conductor 61 is a spiral conductor pattern wound counterclockwise from the outer side to the inner side when viewed in the thickness direction (Z direction). The coil conductor 62 is a rectangular or substantially rectangular conductor pattern. The first end (the end of the outermost periphery of the coil conductor 61) of the coil conductor 61 is electrically connected to the conductor 56 via one of the interlayer connection conductors. The coil conductor 62 is electrically connected to the conductor 57 via one of the interlayer connection conductors.

The insulating base material 16 is a flexible rectangular or substantially rectangular flat plate. A coil conductor 63 is located on a lower surface of the insulating base material 16 (back surface of the insulating base material 16 in FIG. 2). In the insulating base material 16, a plurality of interlayer connection conductors extending in the thickness direction (Z direction) is provided.

The coil conductor 63 includes a spiral conductor pattern wound counterclockwise from the inner side to the outer side when viewed in the thickness direction (Z direction). The first end of the coil conductor 63 (the innermost end of the coil conductor 63) is electrically connected to the second end of the coil conductor 61 (the innermost end of the coil conductor 61) via one of the interlayer connection conductors. The second end of the coil conductor 63 (the end of the outermost periphery of the coil conductor 63) is electrically connected to the coil conductor 62 via one of the interlayer connection conductors.

The coil conductors 61, 62, and 63 are located, respectively, on a plurality of insulating base materials 15 and 16 and included in a helical coil antenna AN. As illustrated in FIGS. 3A and 3B, the coil antenna AN includes a winding axis AX1 extending along the thickness direction (Z direction). The coil antenna AN is, for example, a radiating element of an antenna that is able to be included in a near field communication (NFC) system.

The first end of the coil conductor 61 and the second end of the coil conductor 63 correspond to the "both ends of the coil conductor" in the present preferred embodiment. That is, in the multilayer substrate 101, the "both ends of the coil conductor" is on the outermost periphery of the coil conductor when viewed in the thickness direction (Z direction).

As illustrated in FIGS. 3A and 3B, the coil antenna AN of the multilayer substrate 101 substantially entirely overlaps the magnetic member 4 when viewed in the thickness direction (Z direction). The "substantially entire" described herein does not strictly refer to the "entire" of the coil antenna AN. The portion that provides a magnetic field of the coil antenna AN may overlap the magnetic member 4 when viewed in the thickness direction (Z direction). For example, even if portions at both ends of the coil antenna AN each having a length of about ⅕ of a total length of the coil antenna AN are not overlapped with the magnetic member 4 when viewed in the thickness direction (Z direction), the coil antenna AN "substantially entirely" overlaps the magnetic member 4.

The mounting components 1, 2, and 3 are mounted on the first main surface VS1 of the laminated body 10. The mounting components 1, 2, and 3 are electrically connected to the electrodes 31, 32, 33, 34, 35, 36, 37, and 38 exposed on the first main surface VS1 of the laminated body 10. The mounting components 1, 2, and 3 are, for example, chip components of chip type inductors or chip type capacitors, including a ceramic material, RFIC elements, and impedance matching circuits. In the case where the RFIC element is mounted on the laminated body, since an RF signal (high-frequency signal) is processed by an RFIC element located in the first region F1, a signal transmitting a wiring pattern may be a digital signal which is not easily affected by noise.

As illustrated in FIG. 3B, the mounting components 1, 2, and 3 are located on a side opposite to the coil antenna AN across the magnetic member 4 in the thickness direction (Z direction). Further, as illustrated in FIGS. 3A and 3B, when viewed in the thickness direction (Z direction), the mounting components 1, 2, and 3 entirely overlap the magnetic member 4. As described below, components corresponding to the mounting components 1, 2, and 3 may be incorporated in the laminated body 10. In this case also, the mounting components are preferably located on a side opposite to the coil antenna AN across the magnetic member 4 in the thickness direction (Z direction).

Further, as illustrated in FIGS. 2 and 3B, the insulating base materials 11 and 12b in the second region F2 are located on the side opposite to the coil antenna AN across the magnetic member 4 in the thickness direction (Z direction).

The multilayer substrate 101 according to the present preferred embodiment provides the following features.

In the multilayer substrate 101 according to the present preferred embodiment, the coil antenna AN is located in the first region F1, and the external connection terminals E11, E12, E13, E14, E21, E22, E23, and E24 are located in the second region F2 which is more flexible than the first region F1. Accordingly, the coil antenna AN is able to be easily located at a position away from other electronic components and structures that may affect the coil antenna AN. In addition, the coil antenna AN is able to be easily located at a position away from a metal member, for example, a conductor pattern and a ground conductor, in contact with a wiring substrate or the like that is able to affect the coil antenna AN. That is, the degree of freedom in arrangement of the coil antenna AN is high, and deterioration of the communication characteristics of the coil antenna AN depending on the position of arrangement is able to be significantly reduced or prevented. Further, since the mounting components 1, 2, and 3 are mounted on the laminated body 10, the mounting components 1, 2, and 3 are able to be located in a gap between substrates, and a space is able to be utilized more effectively than the case where the mounting components 1, 2, and 3 are mounted on the wiring substrate.

In the multilayer substrate 101, the coil conductors 61 and 63 each include a spiral shape, and the coil antenna AN includes a helical shape. Accordingly, the coil antenna AN with a large number of turns is able to be easily provided. In addition, the size of the first region F1 in which the coil antenna AN is provided is able to be significantly reduced.

Furthermore, the multilayer substrate 101 according to the present preferred embodiment includes the coil antenna AN with the winding axis AX1 extending along the thickness direction (Z direction) in the first region F1. Therefore, as compared with the case where the coil antenna with the winding axis orthogonal or substantially orthogonal to the thickness direction (Z direction), the coil antenna AN including a large coil opening diameter is able to be easily defined and communicate with a coil antenna of a communication partner with a relatively wide communication range or communication radius in which communication between the antenna AN and the coil antenna of the communication partner is possible.

The multilayer substrate 101 according to the present preferred embodiment includes the magnetic member 4. Therefore, under an action with high magnetic permeability of the magnetic member 4, a predetermined inductance is able to be provided by the coil antenna AN (coil conductor) with a small number of turns. Further, due to a magnetism collecting effect of the magnetic member 4, magnetic coupling with the coil antenna of the communication partner is able to be significantly improved. Also, due to a magnetic shielding effect of the magnetic member 4, radiation of a magnetic field from the coil antenna AN toward the opposite side of the coil antenna AN across the magnetic member 4 in the thickness direction (Z direction) is significantly reduced or prevented.

In addition, the coil antenna AN of the multilayer substrate 101 substantially entirely overlaps the magnetic member when viewed in the thickness direction (Z direction). Accordingly, since the magnetic member 4 overlaps a coil opening of the coil antenna AN, the above-described magnetic shielding effect of the magnetic member 4 is further significantly improved.

In the multilayer substrate 101, the mounting components 1, 2, and 3 are located on a side opposite to the coil antenna AN across the magnetic member 4 in the thickness direction (Z direction). Therefore, unnecessary coupling between the mounting components 1, 2, and 3 and the coil antenna AN is significantly reduced or prevented by the magnetic shielding effect of the magnetic member 4.

Further, in the multilayer substrate 101, the mounting components 1, 2, and 3 entirely overlap the magnetic member 4 when viewed in the thickness direction (Z direction). Accordingly, the magnetic member is sandwiched between the mounting components 1, 2, and 3 and the coil antenna AN, and the magnetic member 4 is certainly positioned between the mounting components 1, 2, and 3 and the coil antenna AN in the thickness direction (Z direction). Therefore, the magnetic member 4 magnetically shields the coil antenna AN. Therefore, unnecessary coupling between the mounting components 1, 2, and 3 and the coil antenna AN is significantly reduced or prevented. Therefore, changes in antenna characteristics are significantly reduced or prevented.

As illustrated in FIG. 3B, since the magnetic member 4 is incorporated in the first region F1 of the laminated body 10, the multilayer substrate 101 is able to significantly reduce or prevent that the magnetic member 4 is damaged due to external force, impact, or the like. In addition, since the magnetic member 4 is incorporated into the laminated body 10, connection between conductors in the thickness direction (Z direction) is able to be easily performed by an interlayer connection conductor.

In the multilayer substrate 101, the coil conductors 61, 62, and 63 included in the coil antenna AN are located, respectively, on a plurality of the insulating base materials 15 and 16, and the first end of the coil conductor 61 and the second end of the coil conductor 63, corresponding to "both ends of the coil conductor" in the present preferred embodiment, are on the outermost periphery of the coil conductor when viewed in the thickness direction (Z direction). Accordingly, in the first region F1, an interlayer connection conductor located at a position that avoids the magnetic member 4 and the coil antenna AN is able to be easily electrically connected.

In the multilayer substrate 101, the insulating base materials 11 and 12b in the second region F2 are located on a side opposite to the coil antenna AN across the magnetic member 4 in the thickness direction (Z direction). Accordingly, unnecessary coupling between the wiring patterns 21, 22, 23, and 24 located on the insulating base material 11 in the second region F2 and the coil antenna AN is significantly reduced or prevented by a magnetic shielding effect of the magnetic member 4. Also, due to a magnetic shielding effect of the magnetic member 4, radiation of a magnetic field from the coil antenna AN toward the opposite side of the coil antenna AN across the magnetic member 4 in the thickness direction (Z direction) is significantly reduced or prevented.

In the multilayer substrate 101, the wiring patterns 21, 22, 23, and 24 are provided in the longitudinal direction (Y direction) in parallel or substantially in parallel with one another. Among the wiring patterns 21, 22, 23, and 24, the wiring patterns 21 and 24 positioned on the outermost side in an arrangement direction (Y direction) of the wiring patterns 21, 22, 23, and 24 are "ground wiring patterns" electrically connected to the ground. Accordingly, due to an electric field shielding effect of the wiring patterns 21 and 24 which are the ground wiring patterns, unnecessary coupling between the wiring patterns 22 and 23 located on the insulating base material 11 in the second region F2 and the coil antenna AN, or unnecessary coupling with the outside are significantly reduced or prevented. Furthermore, unnecessary radiation from the wiring patterns 22 and 23 is able to be significantly reduced or prevented.

Further, in the multilayer substrate 101, the coil antenna AN substantially entirely overlaps the magnetic member 4 when viewed in the thickness direction (Z direction). However, the present preferred embodiment is not limited to this specific structure. At least a portion of the coil antenna AN may overlap the magnetic member 4 when viewed in the thickness direction (Z direction). By overlapping a portion of the coil antenna AN with the magnetic member 4 when viewed in the thickness direction (Z direction), directivity of the coil antenna AN is able to be changed.

A method of manufacturing the multilayer substrate 101 is described below.

First, a metal foil (for example, a copper foil) is laminated on one main surface of the insulating base material 11, 12a, 12b, 13, 14, 15, and 16 in a collective substrate state. By patterning the metal foil by photolithography, the electrodes 31, 32, 33, 34, 35, 36, 37, and 38, the conductors 41, 42, 43, 44, 45, 46, 47, 48, 49, 51, 52, 53, 54, and 55, the coil conductors 61, 62, and 63, the wiring patterns 21, 22, 23, and 24, and the external connection terminals E11, E12, E13, E14, E21, E22, E23, and E24 are provided. The opening AP is provided in the insulating base material 14. Further, interlayer connection conductors are formed in the insulating base materials 11, 12a, 12b, 13, 14, 15, and 16 in the collective substrate state. The interlayer connection conductor is provided by filling a conductive paste containing at least one of copper, silver, and tin after providing a through hole by a laser and the like, and curing the conductive paste in a subsequent heating and pressing step. For example, a thermoplastic resin base material, for example, liquid crystal polymer, is included in the insulating base materials 11, 12a, 12b, 13, 14, 15, and 16. Next, the insulating base materials 11, 12a, 12b, 13, 14, 15, and 16 are laminated, heated, and pressed. Accordingly, the conductive paste is solidified, and the insulating base materials 11, 12a, 12b, 13, 14, 15, and 16 are pressed, and the laminated body 10 in a collective substrate state is formed. The insulating base material 14 is laminated in a state where the magnetic member 4 is accommodated in the opening AP. Accordingly, the magnetic member 4 is buried in the laminated body 10.

Then, the mounting components 1, 2, and 3 are connected (bonded) to the electrodes 31, 32, 33, 34, 35, 36, 37, and 38 exposed on the first main surface VS1 of the laminated body 10. The connection (bonding) with the first main surface VS1 of the laminated body 10 is able to be performed by, for example, solder and a conductive adhesive.

Then, the laminated body 10 in a collective substrate state is divided to provide individual multilayer substrates 101. Steps (3) and (4) may be performed in reverse order.

Next, an electronic device including the multilayer substrate 101 will be described with reference to the drawings.

Figure 4A:
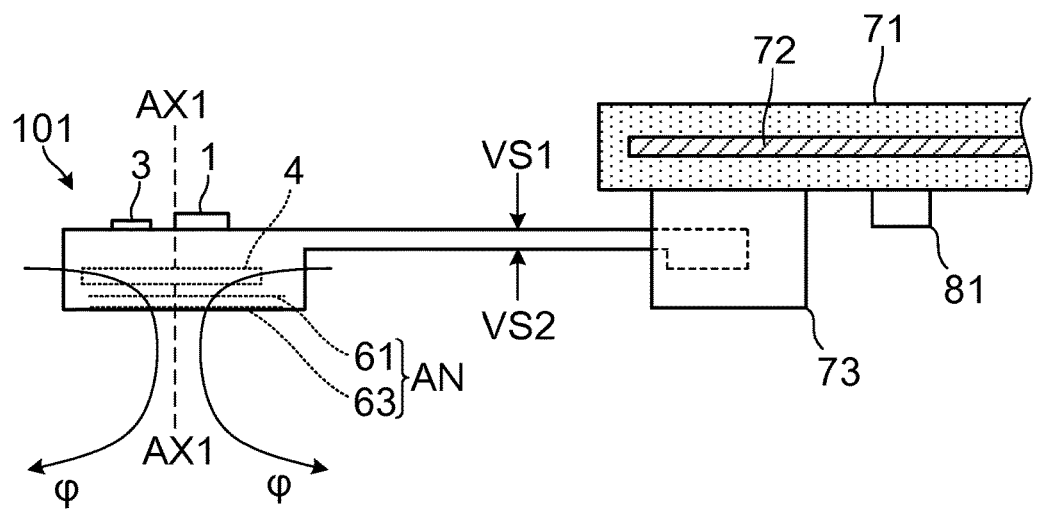
FIG. 4A is a cross-sectional view indicating a shape of the multilayer substrate shown in FIG. 1 provided in an electronic device.
Figure 4B:
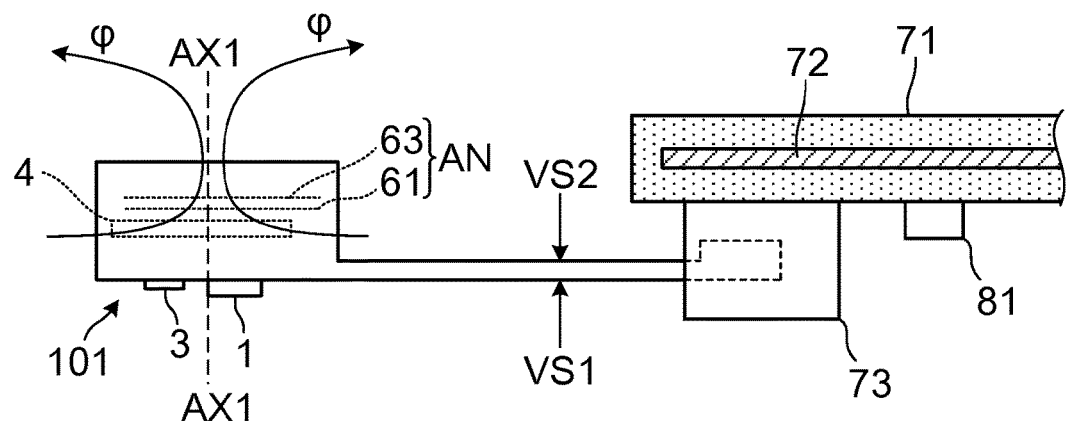
FIG. 4B is a cross-sectional view indicating a shape of the multilayer substrate shown in FIG. 1 provided in an electronic device which is different from the electronic device indicated in FIG. 4A.
Figure 5:
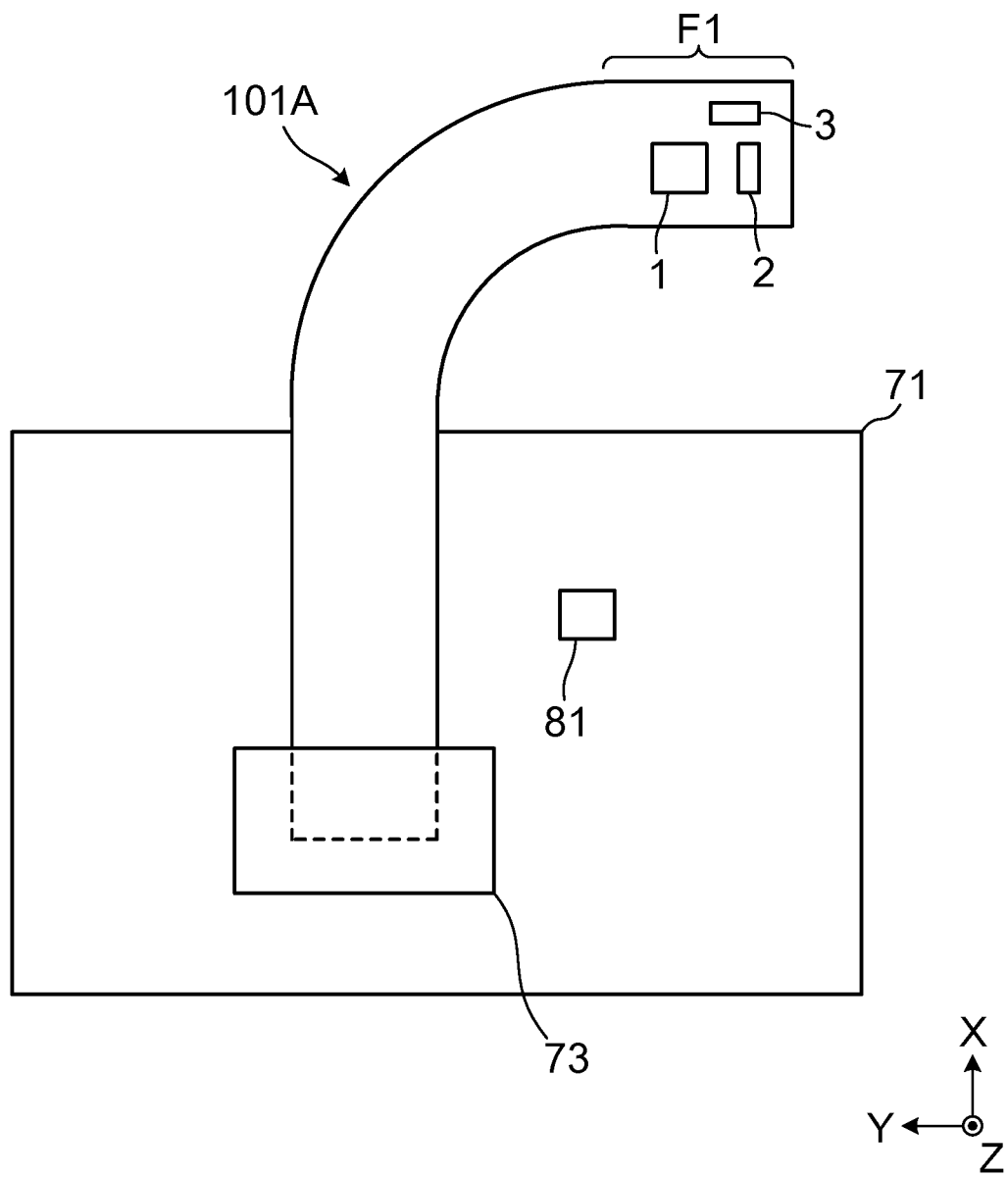
FIG. 5 is a plan view indicating a shape of a multilayer substrate provided in an electronic device.

FIG. 4A is a cross-sectional view indicating a shape of the multilayer substrate 101 provided in an electronic device. FIG. 4B is a cross-sectional view indicating a shape of the multilayer substrate 101 provided in an electronic device, which is different from the electronic device indicated in FIG. 4A. FIG. 5 is a plan view indicating a shape of a multilayer substrate 101A provided in an electronic device.

In FIGS. 4A and 4B, the thickness of each portion is indicated in an exaggerated manner. The cross-sectional views of the electronic devices in each of the following preferred embodiments also include exaggerated features. In FIGS. 4A and 4B, a housing of the electronic device is not illustrated for clarity. Further, in FIG. 5, a wiring pattern provided in the second region and a housing of the electronic device are not illustrated for clarity.

The electronic device illustrated in FIGS. 4A, 4B, and 5 includes the multilayer substrate 101 and a wiring substrate 71 inside including a ground conductor 72. The electronic device is, for example, a portable communication device such as a wearable terminal or a smartphone. The wiring substrate 71 is, for example, a multilayer printed wiring substrate.

On one main surface of the wiring substrate 71 (a lower surface of the wiring substrate 71 in FIGS. 4A and 4B, and a surface of the wiring substrate 71 in FIG. 5), a plug-in connector 73 and a surface mount component 81 are mounted. The connector 73 is electrically connected to, for example, a feeding circuit, a ground, and a communication circuit of the wiring substrate 71. An external connection terminal of the multilayer substrate 101 is inserted into the connector 73. The surface mount component 81 is, for example, a chip component of a chip inductor or a chip capacitor, including a ceramic material.

In the electronic device illustrated in FIG. 4A, the first main surface VS1 in the second region of the multilayer substrate 101 faces one main surface of the wiring substrate 71. The external connection terminal of the multilayer substrate 101 is electrically connected to the wiring substrate 71 via the connector 73.

In the electronic device illustrated in FIG. 4B, the second main surface VS2 in the second region of the multilayer substrate 101 faces one main surface of the wiring substrate 71. The external connection terminal of the multilayer substrate 101 is electrically connected to the wiring substrate 71 via the connector 73.

The electronic device illustrated in FIG. 5 includes the multilayer substrate 101A. The multilayer substrate 101A is different from the multilayer substrate 101 according to the first preferred embodiment in that the second region of the laminated body is bent in a longitudinal direction (Y direction in FIG. 5) when viewed in a thickness direction (Z direction). Other structures are the same as or similar to those of the multilayer substrate 101.

Accordingly, an electronic device is able to be provided which includes the multilayer substrate in which deterioration in communication characteristics of the coil antenna AN depending on the position of arrangement is significantly reduced or prevented, and the degree of freedom in arrangement is significantly improved.

In the electronic device, according to locations of the multilayer substrates 101 and 101A, the coil antenna AN does not overlap the wiring substrate 71 when viewed in a vertical direction of the main surface of the wiring substrate 71 (the Z direction in FIGS. 4A, 4B and 5). Accordingly, the coil antenna AN is located at a position spaced away from a metal member, for example, a conductor pattern or a ground conductor, in contact with the wiring substrate 71 or the like that is able to affect the coil antenna AN. Therefore, metal members (the ground conductor 72 of the wiring substrate 71, the conductor pattern on the wiring substrate 71, etc.), other electronic components (surface mount components) and structures are not located adjacent to or in vicinity of the coil antenna AN. As a result, magnetic flux interlinking with the coil antenna AN (refer to the magnetic flux φ in FIGS. 4A and 4B) is not disturbed, and a decrease in the magnetic flux interlinking with a coil antenna of a communication partner is able to be significantly reduced or prevented. In addition, since the coil antenna AN and the metal member are not unnecessarily coupled, and a decrease in the coupling coefficient with the coil antenna of the communication partner is significantly reduced or prevented, communication characteristics of the coil antenna are able to be significantly improved.

In the electronic devices illustrated in FIGS. 4A, 4B, and 5, a portion of the second region of the multilayer substrate 101 faces one main surface of the wiring substrate 71. However, the preferred embodiments of the present invention are not limited to this specific structure. If the first region (coil antenna AN) does not to overlap the wiring substrate 71 when viewed in a vertical direction of the main surface of the wiring substrate 71, the entire second region F2 of the multilayer substrate 101 may face the main surface of the wiring substrate 71. Further, the first main surface VS1 and the second main surface VS2 of the multilayer substrate 101 may be perpendicular or substantially perpendicular to one main surface of the wiring substrate 71.

Figure 6A:
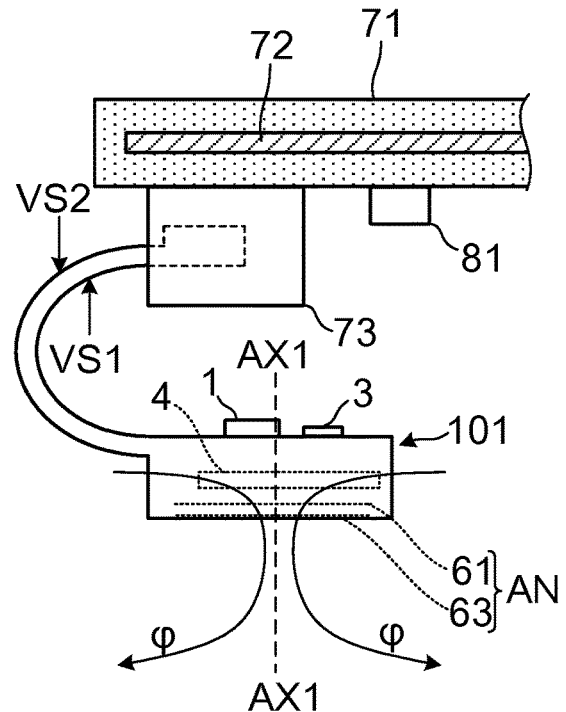
FIG. 6A is a cross-sectional view indicating a shape of the multilayer substrate shown in FIG. 1 provided in an electronic device in a bent state.
Figure 6B:
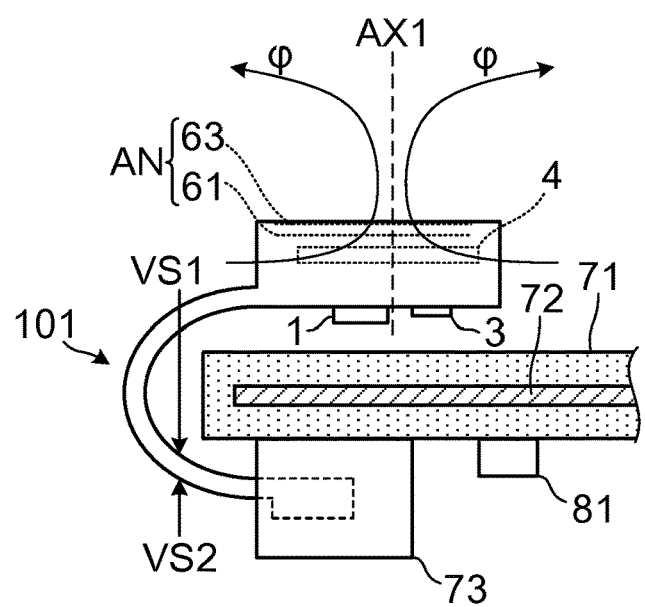
FIG. 6B is a sectional view indicating a shape of the multilayer substrate shown in FIG. 1 provided in an electronic device which is different from the electronic device indicated in FIG. 6A.

Next, another electronic device including the multilayer substrate 101 will be described with reference to the drawings. FIG. 6A is a cross-sectional view indicating a shape of the multilayer substrate 101 provided in an electronic device in a bent state. FIG. 6B is a sectional view indicating a shape of the multilayer substrate 101 provided in an electronic device which is different from the electronic device indicated in FIG. 6A.

The electronic device illustrated in FIGS. 6A and 6B is different from the electronic device illustrated in FIGS. 4A and 4B in that an external connection terminal of the multilayer substrate 101 is electrically connected to the wiring substrate 71 in a state where the second region is bent.

In the electronic device illustrated in FIG. 6A, the second main surface VS2 in the second region of the multilayer substrate 101 faces one main surface of the wiring substrate 71. The external connection terminal of the multilayer substrate 101 is electrically connected to the wiring substrate 71 via the connector 73. In the multilayer substrate 101, the second region of the laminated body 10 is bent and the first main surface VS1 in the first region faces inward. Therefore, as illustrated in FIG. 6A, according to the location of the multilayer substrate 101, the first main surface VS1 of the first region faces one main surface of the wiring substrate 71.

In the electronic device illustrated in FIG. 6B, the first main surface VS1 in the second region of the multilayer substrate 101 faces one main surface of the wiring substrate 71. The external connection terminal of the multilayer substrate 101 is electrically connected to the wiring substrate 71 via the connector 73. In the multilayer substrate 101, the second region of the laminated body 10 is bent and the first main surface VS1 in the first region faces inward. Therefore, as illustrated in FIG. 6B, according to the location of the multilayer substrate 101, the first main surface VS1 of the first region faces the other main surface of the wiring substrate 71.

In the electronic device, the multilayer substrate 101 is electrically connected to the wiring substrate 71 in a state where the second region is bent. Accordingly, an electronic device is able to be provided in which the multilayer substrate 101 provides a high degree of freedom in arrangement. Further, a path of magnetic flux generated at the coil antenna AN is able to be ensured, and an electronic device with directivity in various directions is able to be provided.

As illustrated in FIGS. 6A and 6B, in the above-described electronic device, a distance between the magnetic member 4 and the wiring substrate 71 is shorter than a distance between the coil antenna AN and the wiring substrate 71. Further, as illustrated in FIGS. 6A and 6B, the magnetic member 4 is between the coil antenna AN and the wiring substrate 71. Accordingly, in the thickness direction (Z direction), the magnetic member 4 is preferably located between the mounting components 1, 2, and 3 and the coil antenna AN, and the magnetic member 4 magnetically shields the coil antenna AN. Therefore, unnecessary coupling between the coil antenna AN and a metal member (the ground conductor 72 of the wiring substrate 71, the conductor pattern on the wiring substrate 71) and a surface mount component (an electronic component and structure mounted on the wiring substrate 71) is significantly reduced or prevented. Therefore, the decrease in a coupling coefficient with an antenna of a communication partner is significantly reduced or prevented, and communication characteristics of the coil antenna are significantly improved.

Figure 7:
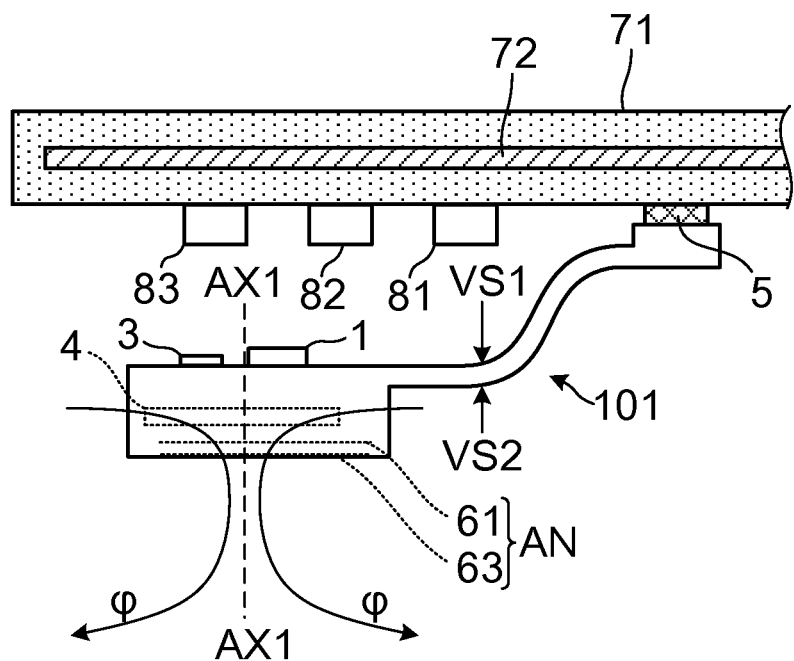
FIG. 7 is a cross-sectional view indicating a shape of the multilayer substrate shown in FIG. 1 which is provided in an electronic device in a bent state and is different from the electronic device indicated in FIGS. 6A and 6B.

FIG. 7 is a cross-sectional view indicating a shape of the multilayer substrate 101 provided in an electronic device in a bent state, which is different from the electronic device indicated in FIGS. 6A and 6B.

In the electronic device illustrated in FIG. 7, no connector is mounted on one main surface of the wiring substrate 71. Surface mount components 82 and 83 are further mounted on the one main surface of the wiring substrate 71. In the electronic device, the first main surface VS1 of the first region and the second region of the multilayer substrate 101 faces one main surface of the wiring substrate 71. The external connection terminal of the multilayer substrate 101 is electrically connected to the wiring substrate 71 via the conductive bonding material 5.

Even with the components and elements shown in FIG. 7, the same or similar operational features are able to be provided as those of the electronic device illustrated in FIGS. 6A and 6B. As illustrated in FIG. 7, a connector is dispensable in connection between the external connection terminal of the multilayer substrate 101 and the wiring substrate 71.

Figure 8:
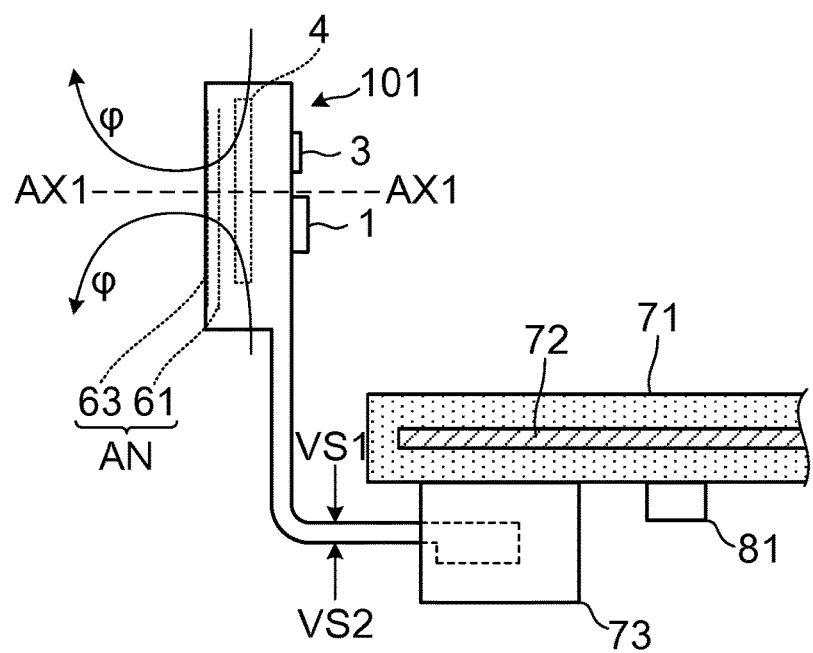
FIG. 8 is a cross-sectional view indicating a shape of the multilayer substrate shown in FIG. 1 provided in an electronic device in a bent state.

FIG. 8 is a cross-sectional view indicating a shape of the multilayer substrate 101 provided in an electronic device in a bent state.

In the electronic device illustrated in FIG. 8, the first main surface VS1 in the second region of the multilayer substrate 101 faces one main surface of the wiring substrate 71. The external connection terminal of the multilayer substrate 101 is electrically connected to the wiring substrate 71 via the connector 73.

In the electronic device, the winding axis AX1 of the coil antenna AN is not perpendicular to the main surface of the wiring substrate 71. In particular, it is preferable that the winding axis AX1 of the coil antenna AN is parallel or substantially parallel to the main surface of the wiring substrate 71. Accordingly, a path of the magnetic flux generated at the coil antenna is able to be provided. That is, distribution of the magnetic flux generated at the coil antenna by unnecessary coupling with the wiring substrate or by a metal member and a surface mount component provided in contact with the wiring substrate is significantly reduced or prevented. Therefore, since the magnetic flux interlinking with the coil antenna AN (refer to the magnetic flux φ in FIG. 8) is not disturbed, the magnetic flux interlinking with a coil antenna of the communication partner increases, and the communication distance is able to be increased. Accordingly, preferably, the multilayer substrate 101 is electrically connected to the wiring substrate 71 in a state where the second region is bent, and a surface mount component (electronic component), a structure, and the like are not located adjacent to or in a vicinity of the coil antenna AN.

Even with the components and elements shown in FIG. 8, the same or similar operational features are able to be provided as those of the electronic device illustrated in FIGS. 4A and 4B.

Second Preferred Embodiment

Figure 9:
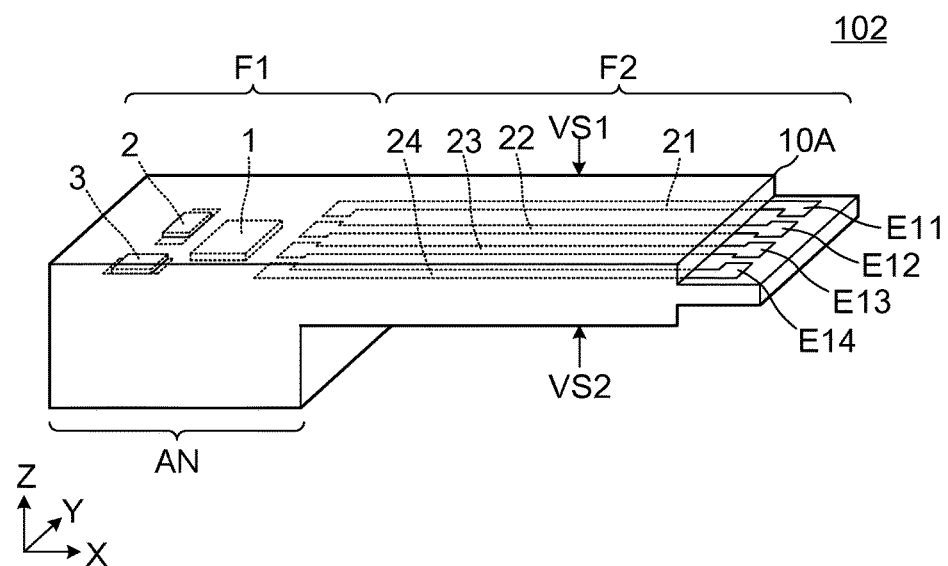
FIG. 9 is an external perspective view of a multilayer substrate according to a second preferred embodiment of the present invention.

FIG. 9 is an external perspective view of a multilayer substrate 102 according to a second preferred embodiment of the present invention. FIG. 10 is an exploded plan view of the multilayer substrate 102.

The multilayer substrate 102 is different from the multilayer substrate 101 according to the first preferred embodiment in that a laminated body 10A is included. The laminated body 10A is different from the laminated body 10 of the multilayer substrate 101 in that the laminated body 10A further includes an insulating base material 17, and an insulating base material 12 instead of the insulating base materials 12a and 12b. Further, the multilayer substrate 102 does not include the external connection terminals E21, E22, E23, and E24. Other components and elements are the same or substantially the same as the multilayer substrate 101 according to the first preferred embodiment.

Hereinafter, portions different from the multilayer substrate 101 according to the first preferred embodiment will be described.

The laminated body 10A is formed preferably by laminating a plurality of flexible insulating base materials 17, 11, 12, 13, 14, 15, and 16 in this order, in the thickness direction (Z direction in FIG. 9). The insulating base material 17 in FIG. 9 is the uppermost layer, and the insulating base material 16 is the lowermost layer.

The insulating base materials 17 and 12 are flexible rectangular or substantially rectangular flat plates. The length in the longer-side direction (X direction) of the insulating base material 12 is equal or substantially equal to the length in the longer-side direction (X direction) of the insulating base materials 17. The insulating base material 17 is laminated on the insulating base material 11. Therefore, a portion of the mounting components 1, 2, and 3 mounted on the insulating base material 11, and a portion of wiring patterns 21, 22, 23, and 24 provided on the insulating base material 11 are buried (accommodated in) in the laminated body 10A by laminating the insulating base materials 17, 11, 12, 13, 14, 15, and 16.

In the multilayer substrate 102, external connection terminals E11, E12, E13, and E14 are located only on a first main surface VS1 of a second region F2 of the laminated body 10A.

Even with the components and elements shown in FIG. 9, the same or similar operational features are able to be provided as the multilayer substrate 101 according to the first preferred embodiment.

In the multilayer substrate 102, a portion of the mounting components 1, 2, and 3 and the wiring patterns 21, 22, 23, and 24 is buried (accommodated) in the laminated body 10A. Therefore, damage of a portion of the mounting components 1, 2, and 3 and the wiring patterns 21, 22, 23, and 24 by external force, impact, and the like is significantly reduced or prevented. Further, the electrical connection reliability between electrodes 31, 32, 33, 34, 35, 36, 37, and 38 located on the insulating base material 11 and the mounting components 1, 2, and 3 is significantly improved.

Other Preferred Embodiments

In the above-described preferred embodiments, examples are provided in which the laminated body 10 is substantially a long flat plate. However, the preferred embodiments of the present invention are not limited to this specific structure. The planar shape of the laminated body 10 (multilayer substrate) is able to be appropriately changed to, for example, a circle, an ellipse, a polygon, an L shape, and a Y shape, within the scope of operations and features of the preferred embodiments of the present invention.

Further, in the above-described preferred embodiments, an example is provided in which six insulating base materials are laminated in the laminated body 10, and seven insulating base materials are laminated in the laminated body 10A. However, the preferred embodiments of the present invention are not limited to this specific structure. The number of layers of the laminated body (multilayer substrate) is able to be appropriately changed within the scope of operations and features of the preferred embodiments of the present invention.

In the multilayer substrates 101, 101A, and 102 according to the above-described preferred embodiments, an example including three mounting components 1, 2, and 3 is indicated. However, the preferred embodiments of the present invention are not limited to this specific structure. A type, quantity, and the like of the mounting component are able to be appropriately changed within the scope of operations and features of the preferred embodiments of the present invention. In addition, as well as the mounting component, a circuit provided in the multilayer substrate is not limited to the circuit according to the above-described preferred embodiments and is able to be appropriately changed. A Bluetooth (registered trademark) module may be located in the first region F1 as a mounting component. In this case, by including the Bluetooth (registered trademark) module to communicate with a communication circuit mounted on a wiring substrate and the like, the number of communication signal lines is able to be significantly reduced. By including a wireless communication module, for example, Bluetooth (registered trademark) or Wi-Fi (registered trademark), it is possible to significantly reduce or remove wiring patterns for digital signals and therefore significantly improve flexibility of the second region F2 by significantly reducing the number of wiring patterns included in the second region F2.

In the above-described preferred embodiments, the coil antenna AN includes the coil conductors 61, 62, and 63 located, respectively, on two different insulating base materials 15 and 16. However, the coil antenna AN does not necessarily include this specific structure. The quantity, shape, structure, number of turns, and the like of the coil antenna AN are able to be appropriately changed within the scope of operations and features of the preferred embodiments of the present invention. For example, the coil antenna AN may include a coil conductor located on one insulating base material or may include a coil conductor located, respectively, on three or more insulating base materials. Further, the coil conductor is not limited to a spiral shape and may be a loop shape or the like. Furthermore, in the above-described preferred embodiments, the coil antenna AN includes a winding axis extending along the thickness direction (Z direction). However, the coil antenna AN does not necessarily include this specific structure. For example, the coil antenna AN may include a winding axis extending along a vertical direction of the thickness direction (Z direction).

In the above-described preferred embodiments, an example is provided in which the magnetic member 4 is one rectangular parallelepiped or substantially rectangular parallelepiped magnetic ferrite plate. However, the preferred embodiments of the present invention are not limited to this specific structure. The shape, quantity, material, and the like of the magnetic member 4 are able to also be appropriately changed within the scope of operations and features of the present invention.

In the above-described preferred embodiments, the mounting components 1, 2, and 3 (components) entirely overlap the magnetic member 4 when viewed in the thickness direction (Z direction). However, the preferred embodiments of the present invention are not limited to this specific structure. Only a portion of the mounting components may overlap the magnetic member 4 when viewed in the thickness direction (Z direction). However, a magnetic shielding effect of the magnetic member 4 is high in the case where the mounting component (component) entirely overlaps the magnetic member 4 when viewed in the thickness direction (Z direction).

Further, in the above-described preferred embodiments, an example is provided in which the four wiring patterns 21, 22, 23, and 24 provided in the longitudinal direction (Y direction) in parallel or substantially in parallel to each other extends linearly in the longer-side direction of the insulating base material. However, the preferred embodiments of the present invention are not limited to this specific structure. The shape, number, wiring path, arrangement direction, and the like of the wiring pattern are able to also be appropriately changed within the scope of operations and features of the preferred embodiments of the present invention.

In the above preferred embodiments, the external connection terminals E11, E12, E13, E14, E21, E22, E23, and E24 include rectangular or substantially rectangular conductor patterns. However, the external connection terminal does not necessarily include this specific structure. The plan shape and the number of the external connection terminals are able to be appropriately changed.

In the above-described preferred embodiments, the external connection terminals are electrically connected to the wiring substrate 71 via the plug-in connector 73. However, the preferred embodiments of the present invention are not limited to this specific structure as long as the external connection terminals are electrically connected to the wiring substrate 71. As described above, the connector 73 is dispensable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
a plurality of insulating base layers that are flexible and are laminated;
a first region including a first number of the laminated insulating base layers;
a second region including a second number of the laminated insulating base layers and being bent, the second number of laminated insulating base layers being less than the first number of laminated insulating base layers;
a coil antenna located in the first region and including a winding axis extending along a lamination direction of the insulating base layers in the first region;
a magnetic member located in the first region;
a component located in the first region and located on a side opposite to the coil antenna across the magnetic member in the lamination direction;
a wiring pattern located in the second region; and
an external connection terminal located in the second region and electrically connected to the wiring pattern; wherein
the component overlaps the magnetic member when viewed in the lamination direction;
at least a portion of the coil antenna overlaps the magnetic member when viewed in the lamination direction; and
the insulating base layers in the second region are in a bent state on a side opposite to the coil antenna across the magnetic member in the lamination direction.

2. The multilayer substrate according to claim 1, wherein the coil antenna includes a coil conductor; and the coil conductor includes a spiral shape.

3. The multilayer substrate according to claim 2, wherein the coil conductor includes a first coil conductor and a second coil conductor; and
the first coil conductor and the second coil conductor are provided on different ones of the plurality of insulating base layers.

4. The multilayer substrate according to claim 3, wherein the first coil conductor and the second coil conductor are electrically connected by a first interlayer connection conductor.

5. The multilayer substrate according to claim 3, wherein the coil conductor further includes a third coil conductor;
the first coil conductor and the third coil conductor are provided on a same one of the plurality of insulating base layers;
the second coil conductor and the third coil conductor are electrically connected by a second interlayer connection conductor; and
the third coil conductor is a rectangular or substantially rectangular conductor pattern.

6. The multilayer substrate according to claim 1, wherein the coil antenna includes a coil conductor;
the coil conductor is provided on the plurality of insulating base layers; and
each end of the coil conductor is located on an outermost periphery of the coil conductor when viewed in the lamination direction.

7. The multilayer substrate according to claim 1, wherein the coil antenna entirely overlaps the magnetic member when viewed in the lamination direction.

8. The multilayer substrate according to claim 1, wherein the wiring pattern includes a plurality of wiring patterns arranged in parallel or substantially in parallel to each other;
the plurality of wiring patterns includes a ground wiring pattern to be electrically connected to the ground; and
the ground wiring pattern is a wiring pattern, among the wiring patterns, located on an outermost side in an arrangement direction in which the plurality of wiring patterns are arranged in parallel or substantially in parallel to each other.

9. An electronic device comprising:
the multilayer substrate according to claim 1; and a wiring substrate; wherein
the external connection terminal of the multilayer substrate is electrically connected to the wiring substrate.

10. The electronic device according to claim 9, wherein the magnetic member is located between the coil antenna and the wiring substrate.

11. The electronic device according to claim 9, wherein the coil antenna does not overlap the wiring substrate when viewed in a direction perpendicular or substantially perpendicular to a main surface of the wiring substrate.

12. The electronic device according to claim 9, wherein, in the multilayer substrate, the winding axis of the coil antenna is not perpendicular to a main surface of the wiring substrate.

13. The multilayer substrate according to claim 1, wherein the second region is more flexible than the first region.

14. The multilayer substrate according to claim 1, wherein each of the first number of the laminated insulating base layers and each of the second number of the laminated insulating base layers is a rectangular or substantially rectangular flat plate.

15. The multilayer substrate according to claim 1, at least one of the first number of the laminated insulating base layers and the second number of the laminated insulating base layers includes an interlayer connection conductor extending in a thickness direction thereof.

16. The multilayer substrate according to claim 15, wherein the interlayer connection conductor is a via conductor.

17. The multilayer substrate according to claim 1, further comprising at least one mounting component mounted on a main surface of the multilayer substrate.

18. The multilayer substrate according to claim 17, wherein the at least one mounting component is a chip component.

19. The multilayer substrate according to claim 17, wherein the magnetic member is located between the coil antenna and the main surface of the multilayer substrate.

20. The multilayer substrate according to claim 1, wherein the second number of laminated insulating base layers included in the second region is one.

* * * * *